United States Patent [19]
Tesauro

[11] Patent Number: 6,077,387
[45] Date of Patent: Jun. 20, 2000

[54] PLASMA EMISSION DETECTION FOR PROCESS CONTROL VIA FLUORESCENT RELAY

[75] Inventor: Mark R. Tesauro, Phoenix, Ariz.

[73] Assignee: STMicroelectronics, Inc., Carrollton, Tex.

[21] Appl. No.: 09/248,359

[22] Filed: Feb. 10, 1999

[51] Int. Cl.[7] .................................................. H01L 21/00
[52] U.S. Cl. .................................. 156/345; 438/7; 438/9; 216/60
[58] Field of Search ............................... 395/23; 438/719; 250/309, 310, 398; 361/234

[56] References Cited

U.S. PATENT DOCUMENTS

| | | | |
|---|---|---|---|
| 4,465,934 | 8/1984 | Westerberg et al. | 250/398 |
| 4,479,848 | 10/1984 | Otsubo et al. | 156/626 |
| 4,493,745 | 1/1985 | Chen et al. | 156/626 |
| 4,954,212 | 9/1990 | Gabriel et al. | 156/627 |
| 5,322,590 | 6/1994 | Koshimizu | 156/626 |
| 5,423,945 | 6/1995 | Marks et al. | 156/662.1 |
| 5,458,732 | 10/1995 | Butler et al. | 216/61 |
| 5,467,883 | 11/1995 | Frye et al. | 216/60 |
| 5,541,411 | 7/1996 | Lindquist et al. | 250/309 |
| 5,576,542 | 11/1996 | Kaga | 250/310 |
| 5,664,066 | 9/1997 | Sun et al. | 395/23 |
| 5,684,669 | 11/1997 | Collins et al. | 361/234 |
| 5,707,486 | 1/1998 | Collins | 156/643.1 |
| 5,733,820 | 3/1998 | Adachi et al. | 438/719 |
| 5,739,051 | 4/1998 | Saito | 438/16 |
| 5,759,424 | 6/1998 | Imatake et al. | 216/60 |

*Primary Examiner*—Thi Dang
*Assistant Examiner*—Rudy Zervignon
*Attorney, Agent, or Firm*—Theodore E. Galanthay; Lisa K. Jorgenson; Peter J. Thoma

[57] ABSTRACT

Method and system for monitoring a plasma etch process performed in a plasma processing chamber, the method and system being capable of accurately monitoring and controlling the plasma etch process without being affected by the change in a plasma light emission transmission characteristically caused by process polymer depositions on a detecting surface or sampling window. The system includes a plasma processing chamber having a wafer to be processed arranged therein, having at least one window to allow fluorescent light emissions to pass through, a plasma generation means for generating a plasma in the processing chamber, a fluorescent target located within the plasma processing chamber for producing a fluorescent light emission, an optical sensor external to the chamber for sensing the fluorescent light emission through the window, a detector for converting the sensed fluorescent light emissions into a signal recognizable by a controller and a controller for controlling the state of the plasma process being performed on the wafer.

20 Claims, 2 Drawing Sheets

PLASMA EMISSION DETECTION FOR PROCESS CONTROL VIA FLUORESCENT RELAY

BACKGROUND OF THE INVENTION

The present invention relates generally to a method of and system for monitoring a plasma etch process for processing a substrate such as a semiconductor device. Plasma etch processes have been used in the semiconductor industry since the 1970's. Generally, a plasma etch process is used to selectively "etch" or remove material from a semiconductor wafer thereby forming a desired microelectronic pattern.

In a plasma etch system, such as a dry etch system for processing semiconductor wafers, processing gas is introduced into a plasma processing chamber (hereinafter simply referred to as a chamber) in a vacuum environment to generate a plasma. Highly chemically reactive ions or radicals are produced by the ionization or the dissociation of the processing gas. Those active particles physically or chemically act to etch off a desired area of a film on a semiconductor substrate to form a microelectronic pattern. For example, in the method and apparatus disclosed in Gabriel et al., U.S. Pat. No. 4,954,212, the plasma etches the top layer of the wafer only when the power supply is activated and when the power reflected by the chamber is relatively low. In U.S. Pat. No. 4,954,212, activating the power supply "strikes" the plasma, and activates the etching process.

In general, while etching any particular layer, plasma light emissions are generated at frequencies corresponding to the chemical makeup of the layer being etched and the etching gas chemistry used. In other words, the layer being etched chemically combines with the plasma, creating predictable chemical compounds, and the plasma light emission frequencies present in the plasma correspond to these chemical compounds.

In many plasma etch processes these frequencies are detected using a light or optical sensor. Typically, the optical sensor is set up, using narrow bandpass filters, to monitor the intensity of light at a frequency associated with the layer being etched. For example, in some etch processes, when the measured intensity falls below a specified threshold, a sensor generates an endpoint signal that is usually transmitted to a controller, which turns off a power supply and thereby stops the etch process.

A plasma light emission spectrometer has been widely used because it can monitor many factors which correspond to an etching characteristic. Perhaps the most important signal to monitor is the endpoint. In other words, determining when to stop the etching process after the layer being etched is removed but before the next layer is destroyed. For example, in U.S. Pat. No. 4,954,212, an endpoint signal is defined as one that either falls or rises at the end of a plasma etch process. Light intensity based endpoint signals that rise at endpoint are typically related to the concentration of reactants in the chamber or the concentration of products or reactions involving the underlying material, while endpoint signals that fall at endpoint are typically related to the concentration of reactive intermediates or products or reactions involving the material being etched.

Due to the extreme environmental conditions within a chamber, the sensor device is usually placed outside the chamber. This configuration requires that the chamber have an emission detection window for the plasma light emissions to pass through before detection by a spectrometer or other sensor device. The detection window is usually made of quartz glass and typically has a diameter of several centimeters.

A major problem encountered during a plasma etch process is the build up of contaminants on the surface of the detection window. This is due to a reaction product which is deposited on the surface of the window, or an unevenness which is created thereon by the impact of the ions from the plasma. As a result, when a plasma light emission passes through the window, a waveform component inherent to the material forming the deposit is absorbed or it is randomly reflected on the inner surface of the window so that the light intensity is decreased. This is a major problem due to the importance of detecting small changes in the intensity of the plasma light emissions. For example, determining the endpoint requires detecting minuscule changes in the plasma light emission intensity. These changes are difficult or impossible to detect when the detection window is coated with contaminants. This problem results in false readings of the state of the etch process, resulting in defective products.

Most of the prior art solutions to this problem involved apparatus and methods for cleaning the deposits from the detection window. Generally, the windows were cleaned following each etch process or when product failures indicated that the window contaminants were sufficient to cause erroneous plasma light emission readings. Usually, the cleaning process required opening the chamber or disrupting manufacturing activities by performing an in-situ cleaning procedure. In addition to exposing sensitive and expensive equipment to potentially frequent accidental damage, this approach consumed valuable time that could otherwise be used for manufacturing production.

Koshimizu, U.S. Pat. No. 5,322,590, discloses a proposed solution to the cleaning problem discussed above. In U.S. Pat. No. 5,322,590, a heating device is proposed for removing or preventing the build-up of contaminants on the window without disrupting the etch process. As discussed in this patent, contaminants are likely to adhere to the coolest portion of the interior of the chamber. Typically, the coolest portion is the detection window. Therefore, a ring-shaped heater is mounted on the outer surface of the observation window. A thermometer is positioned near the heater and detects the window temperature. The thermometer outputs a signal representing the window temperature and a controller controls the power supply attached to the heater. During an etch process, the window is maintained at a predetermined temperature to prevent contaminant deposition. Alternatively, the heater is used to remove the contaminants at the end of an etch process.

Unfortunately, adding these sensitive measurement and heating devices in the hostile plasma etch process environment may contribute to frequent and costly maintenance, and a potential risk for fires. Furthermore, this approach may not be effective for all processing conditions and materials.

Another prior art method and apparatus proposed to overcome the detection inaccuracies resulting from contaminants on the observation window are discussed in Imatake, et al., U.S. Pat. No. 5,759,424. In U.S. Pat. No. 5,759,424, the plasma light emission generated in the chamber, and a light having a known spectrum emitted from a light source external to the chamber and transmitted through the interior of the chamber, are detected. Next, the difference between the light emission of the plasma and the light of the known spectrum is determined. The internal state of the chamber is determined based on the difference between the spectrums. In the preferred embodiment of U.S. Pat. No. 5,759,424, a reference light illumination means is positioned external to the processing chamber and projects a reference light to a plasma light emission monitoring means, via one of a pair of opposing windows to the plasma light emission monitoring means located on the other side of the second window.

In other words, a separate light (reference light) is external to the processing chamber and it is transmitted through the processing chamber via one of a pair of opposing windows and emitted out of the processing chamber via the other window. The reference light is detected by a spectrometer and compared with an original source light (which is not transmitted through the processing chamber) so that the transmissivity for each frequency is determined. Next, the reference light is turned off and the spectrum of the plasma light emission is detected. The spectrum is divided by the transmissivity determined for each frequency by using the reference light so that the detection error due to the affect of the window is compensated and the plasma light emission thereby determined.

Again, the additional sensitive equipment required in this invention may be a problem from a maintenance standpoint because sensitive detection equipment is prone to damage due to the hazards inherent in a chamber environment. Further, the need for a dual windowed chamber may require costly modifications to existing chambers and chamber manufacturing methods. Therefore, the need for an easy, low maintenance and cost effective solution is still apparent.

It is an object of the present invention to overcome the shortcomings of the prior art by providing a simple, efficient and inexpensive method and apparatus for monitoring a plasma etch process without being affected by the change in a plasma light emission transmission characteristic caused by contaminants on a detection window.

BRIEF SUMMARY OF THE INVENTION

An object of the present invention is achieved by a method and system for monitoring a fluorescent light emission produced when a plasma light emission is re-emitted in the form of a fluorescent light emission. In essence, the present invention shifts the frequency of the plasma light emission to a frequency which is not affected by the build-up of contaminant deposits on a chamber's detection window. As discussed earlier, plasma light emissions at low intensities are most affected by these deposits, making small changes in the plasma light emissions nearly impossible to detect. In practice, the window contaminants tend to attenuate light transmission of wavelengths smaller than the optical spectrum (e.g. ultraviolet wavelengths). Most of the visible spectrum is not dramatically affected. In such a scenario, product failures typically occur because the changes in the plasma light emissions cannot be detected, thereby causing the etching process to continue beyond the specified wafer layer. In the present invention, the plasma light emissions are re-emitted in a frequency in the visible spectrum detectable through the contaminants on the window.

In general, detecting a fluorescent light emission requires the use of a filter or a spectrometer to separate the fluorescent light emissions of interest from background emissions. Next, a detector is used to convert the fluorescent light emission into a signal recognizable by a control device. Typical detectors include photomultiplier tubes, photodiodes and charge coupled devices. A photomultiplier tube basically converts the fluorescent light emission into a measurable electrical current. Charge coupled devices, as used in consumer camcorders, and photodiodes perform the same function but through the use of a solid-state semiconductor device. The present invention offers the advantage of using the most common existing equipment to detect the fluorescent light emission.

The source of the fluorescent light emission is a fluorescent object, hereinafter referred to as a "target." The target is located within the chamber and may be positioned so as to optimize detection of the fluorescent light emissions through the detection window. The material comprising the target may be selected depending upon the characteristics of a desired state in an etch process, such as endpoint, or the material may be selected to absorb the plasma light emissions corresponding to a wide range of etch process states.

Further, the target may be configured so as to allow a "fresh" portion of the target to be continuously exposed during an etch process thereby preventing the etch process contaminants from changing the transmission characteristics of the fluorescent material.

In accordance with the present invention, the effect of the change in light transmissivity caused by contaminants on the detection window does not affect the fluorescent light emission thereby providing a simple, accurate and inexpensive measure of the condition in the etch process chamber, preventing the high product failure rates seen previously, and allowing for increased manufacturing time between cleaning of the chamber and chamber windows.

DETAILED DESCRIPTION OF THE INVENTION

Figure 1:
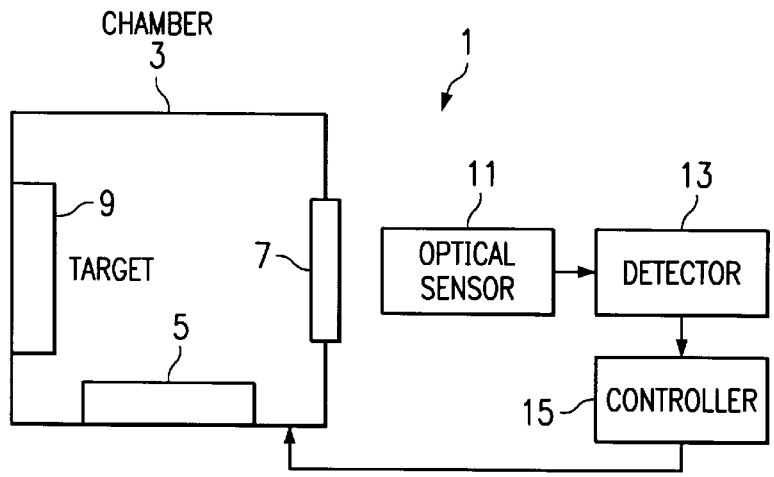
FIG. 1 is a block diagram of an overall configuration of the present invention.

Referring now to the drawings, and first to FIG. 1, a system according to the present invention is designated generally by the numeral 1. System 1 includes a plasma processing chamber 3 having a wafer(s) 5 to be processed arranged therein, having at least one window 7 to allow fluorescent light emissions to pass through, a plasma generation means for generating a plasma in the plasma processing chamber 3, a fluorescent target 9 located within the plasma processing chamber 3 for producing a fluorescent light emission, an optical sensor 11 external to the plasma processing chamber 3 for sensing the fluorescent light emission through the window 7, a detector 13 for converting the sensed fluorescent light emissions into a signal recognizable by a controller 15 and the controller 15 for controlling the state of the plasma process being performed on the wafer 5. The fluorescent target 9 is positioned in the plasma processing chamber 3 so as to maximize visibility of fluorescent light emissions, produced therein, through the window 7. The optical sensor 11 may be, for example, a filter or spectrometer as is commonly used in plasma processing systems. One having ordinary skills in the art will be able to select the device of choice. The detector 13 may be, for example, a photomultiplier tube, photodiode or charge coupled device. Again, one having ordinary skill in the art will be able to select the device of choice. The controller 15 is one that is commonly used in controlling plasma processing chambers.

Figure 2:
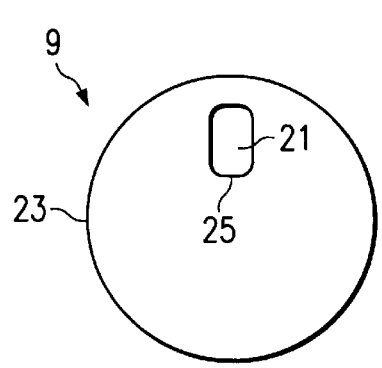
FIG. 2 is a front view of the fluorescent target used in the first embodiment.
Figure 3:
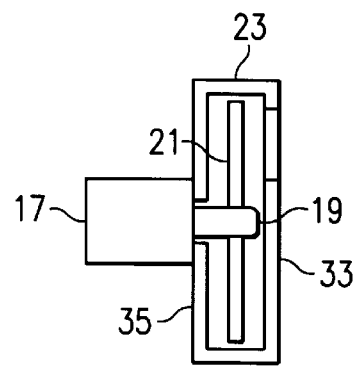
FIG. 3 is a sectional view of the fluorescent target used in the first embodiment.

Referring to FIGS. 2 and 3, the preferred embodiment of the fluorescent target 9 is shown. The fluorescent target 9 includes a motor 17 coupled to, and for rotating a shaft 19. One having ordinary skills in the art will appreciate the need for selecting a motor capable of operating in the hostile environment within the plasma processing chamber 3. However, other embodiments may include positioning a motor outside the chamber with a shaft protruding through the chamber. The fluorescent target 9 also includes a fluorescent sheet 21, which is preferably circular and of a thickness so as to be substantially rigid. In the alternative, a non-rigid fluorescent sheet 21 may be mounted to a rigid material such as aluminum, or a similarly rigid material could be coated with a fluorescent paint or dye. If chemical contamination of the plasma environment by the chosen fluorescent material is of concern, the entire fluorescent sheet 21 (in any embodiment) could be entirely encapsulated in an inert medium transparent to the necessary radiation, such as quartz or sapphire. Regardless of construction, the fluorescent sheet 21 is adapted to receive the shaft 19 so as to be rotated along with the shaft 19 during operation of the motor 17. The fluorescent sheet 21, the paint or the dye is selected to have desirable fluorescent properties, according to the radiation emission of the plasma process to be controlled and the transmission limits of the window 7 and polymer coatings deposited on it. Any of a large number of commercially available fluorescent paints or dyes can be used. One having ordinary skills in the art will be able to select the material of choice.

In the preferred embodiment, the fluorescent target 9 includes a shield 23 to protect the fluorescent sheet 21 from the plasma environment. The shield 23 is generally cylindrical and of a thickness so as to be substantially rigid. The shield 23 has a front surface 33 and a rear surface 35. The rear surface 35 has formed therein a hole located on the center axis of the rear surface 35 and adapted to receive the shaft 19. The diameter of the hole is larger than the diameter of the shaft 19 to prevent contact between the shaft 19 and the rear surface 35. The rear surface 35 is removably attached to the motor 17, allowing the shield 23 to remain stationary when the shaft 19 is rotating. The front surface 33 has formed therein an opening 25 allowing portions of the fluorescent sheet 21 to be exposed to the radiation emission of the plasma. The opening 25 may be of any shape or size appropriate to the application. The shield 23 surrounds the fluorescent sheet 21 without contacting any portion of the fluorescent sheet 21. In other words, the fluorescent sheet 21 may rotate freely within the confines of the shield 23. One having ordinary skills in the art will appreciate that the shield 23 should be an inert and rigid material appropriate to the hostile environment within the plasma processing chamber 3.

In the preferred embodiment, the shaft 19 rotates the fluorescent sheet 21 to continually expose only a small portion of the fluorescent sheet 21 to the plasma process. This preserves the fluorescent material and/or delays the buildup of polymer byproducts which would reduce the transmission of the incoming radiation from the plasma process. Alternatively, the fluorescent sheet 21 may remain in a set position until it is unacceptably so coated at which point the motor would be activated to translate an unexposed portion of the sheet in front of the opening 25.

Figure 4:
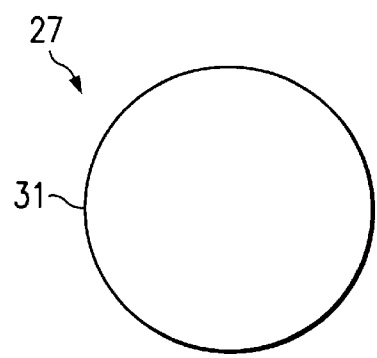
FIG. 4 is a front view of the fluorescent target used in a second embodiment.
Figure 5:
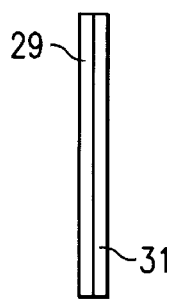
FIG. 5 is a side view of the fluorescent target used in a second embodiment.

Referring to FIGS. 4 and 5, a second embodiment of the fluorescent target 27 is shown. The fluorescent target 27 includes a fluorescent sheet 29 removably attached to a shield 31. As discussed in the preferred embodiment, the fluorescent sheet 29 is preferably circular and of a thickness so as to be substantially rigid. The shield 31 is also preferably circular. Also as discussed in the preferred embodiment, there are alternative embodiments of the fluorescent sheet 29 and the fluorescent material is selected to have fluorescent properties corresponding to the radiation emission of the plasma process and the desired detection wavelength. Further, as discussed in the preferred embodiment, the shield 31 is an inert and transparent material such as quartz or sapphire. Finally, as discussed in the preferred embodiment, the shield 31 is replaced or cleaned at such time that contaminants inhibit the detection of the fluorescent light emissions. Alternatively, the fluorescent sheet 29 could be entirely encapsulated within a suitably transparent material such as quartz or sapphire.

Figure 6:
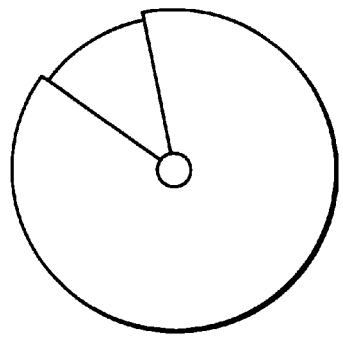
FIG. 6 is a front view of the fluorescent target used in a third embodiment.
Figure 7:
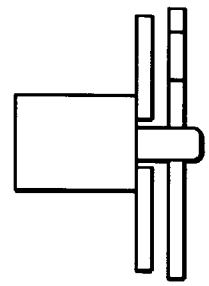
FIG. 7 is a side view of the fluorescent target used in a third embodiment.

Referring to FIGS. 6 and 7, a third embodiment of the fluorescent target 37 is shown. As in the preferred embodiment, the fluorescent target 37 includes a motor 39 coupled to, and for rotating a shaft 41. One having ordinary skills in the art will appreciate the need for selecting a motor capable of operating in the hostile environment within the plasma processing chamber 3. Again, other embodiments may include positioning a motor outside the chamber with a shaft protruding through the chamber.

Also as discussed previously, the fluorescent target 37 includes a shield 43 to protect a fluorescent sheet 45 from the plasma environment. The fluorescent sheet 45, is preferably circular and of a thickness so as to be substantially rigid. The shield 43 is also preferably circular. Again, as discussed previously, there are alternative embodiments of the fluorescent sheet 45 and the fluorescent material is selected to have fluorescent properties corresponding to the radiation emission of the plasma process and the desired detection wavelength. Again, the shield 43 is an inert and transparent material such as quartz or sapphire and is replaced or cleaned at such time that contaminants inhibit the detection of the fluorescent light emissions. Alternatively, the fluorescent sheet 45 could be entirely encapsulated within a suitably transparent material such as quartz or sapphire.

The fluorescent sheet 45 has formed therein a hole located on its center axis and adapted to receive the shaft 41. The diameter of the hole is slightly larger than the diameter of the shaft 41. The shield 43 is adapted to receive the shaft 41 so as to be rotated along with the shaft 41 during operation of the motor 39. The shield 43 is arranged on the shaft 41 so as to be adjacent to the fluorescent sheet 45, but not in contact with same. The shield 43 has formed therein a hole located on the center axis of the shield 43 and is removably coupled to the shaft 41 for rotating the shield 43 with respect to the fluorescent sheet 45. Extending radially from the hole in the shield 43, is a slot 47 for exposing a portion of the fluorescent sheet 45 to a plasma light emission. In the alternative, any shape or size slot may be used.

The shaft 41 rotates the shield 43 to continually expose only a small portion of the fluorescent sheet 45 to the plasma process. As discussed previously, this preserves the fluorescent material and/or delays the buildup of polymer byproducts which would reduce the transmission of the incoming radiation from the plasma process. Alternatively, the shield 43 may remain in a set position until the portion of the fluorescent sheet 45 is unacceptably so coated at which point the motor would be activated to translate an unexposed portion of the sheet in front of the slot 47.

In another embodiment of the invention, the optical sensor 11, detector 13 and controller 15, or any combination thereof, are located within the plasma processing chamber 3. One having ordinary skills in the art will appreciate that equipment located within the plasma processing chamber 3 must be protected from the hostile environment encountered therein.

Figure 8:
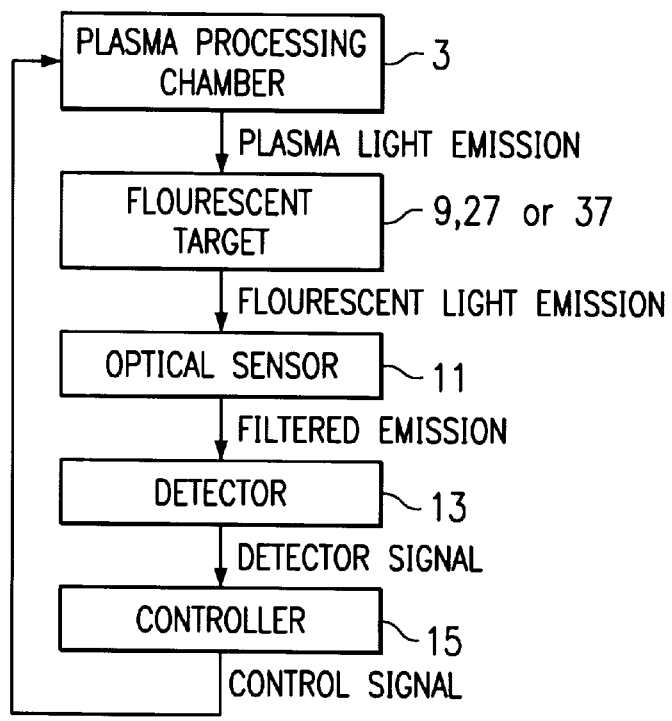
FIG. 8 is a flow chart of the signal processing path on the present invention.

Finally, referring to FIG. 8, the flow chart of the signal processing path on the present invention is shown. Plasma light emissions are produced in the plasma processing chamber 3 during a plasma etch process. Some of the plasma light emissions are absorbed by the fluorescent target 9 or 27 and re-emitted as fluorescent light emissions. The optical sensor 11 derives light emission spectrum data from the fluorescent light emissions and sends it to the detector 13. The detector converts the data into a signal recognized by the controller 15. The controller 15 determines the state of the plasma etch process based on the converted data and sends a control signal to the plasma processing chamber 3. The plasma processing chamber 3 will adjust the plasma etch process conditions to either stop the process or to correct for any deviation from a predetermined condition setting.

What is claimed is:

1. A system for monitoring a plasma etch process comprising:
    a plasma processing chamber;
    a fluorescent emitter for producing a fluorescent light emission in said chamber;
    an optical sensor for sensing the fluorescent light emission;
    a detector for converting the sensed fluorescent light emission into an electrical signal; and
    a controller for controlling the plasma processing chamber based on the electrical signal sent by the detector.

2. The system of claim 1, said chamber having an emission detection window and wherein said sensor, detector and controller are positioned outside said plasma processing chamber.

3. The system of claim 1 wherein said fluorescent emitter comprises a fluorescent material having fluorescent properties corresponding to a desired frequency produced during the process cycle for detection by said detector.

4. The system of claim 1 wherein said fluorescent emitter comprises a plurality of fluorescent materials having fluorescent properties corresponding to desired frequencies produced during the process cycle for detection by said detector.

5. The system of claim 1 wherein said fluorescent emitter comprises a fluorescent target having a fluorescent sheet for producing a fluorescent emission and a shield for protecting said fluorescent sheet from exposure to a plasma etch process environment.

6. The system of claim 5 wherein said shield has an opening in said shield exposing a portion of said fluorescent sheet to the plasma etch process environment.

7. The system of claim 6 wherein said fluorescent sheet and said shield are rotatably coupled allowing exposure of portions of said fluorescent sheet to the plasma etch process environment at variable intervals.

8. The system of claim 7 wherein said fluorescent sheet rotates while said shield remains fixed.

9. The system of claim 7 wherein said shield rotates while said fluorescent sheet remains fixed.

10. The system of claim 5 wherein said target comprises a fluorescent material having fluorescent properties corresponding to a desired frequency produced during the process cycle for detection by said detector.

11. The system of claim 5 wherein said target comprises a plurality of fluorescent materials having fluorescent properties corresponding to desired frequencies produced during the process cycle for detection by said detector.

12. A method of monitoring a plasma etch process, comprising the steps of:
    producing a fluorescent emission in a plasma processing chamber during a plasma etch process cycle; and
    detecting the fluorescent emission produced during the process cycle.

13. A method according to claim 12, including the additional steps of determining a state of the process cycle based on said detecting step and controlling the process cycle based on the state of the process cycle.

14. A method according to claim 13 said determining step including the step of observing a fluorescent emission intensity at a specified frequency.

15. A method of monitoring a plasma etch process, comprising the steps of positioning a fluorescent emitter in a plasma processing chamber and detecting the fluorescent emission produced during a plasma etch process cycle.

16. A method according to claim 15, including the additional step of replacing said fluorescent emitter at the end of the plasma etch process cycle.

17. A method according to claim 16, said replacing step including the step of selecting a new means for producing a fluorescent emission based on a desired frequency to be detected during a new plasma etch process cycle.

18. A method according to claim 15, including the additional step of automatically replacing said fluorescent emitter as needed during the process cycle.

19. A method according to claim 15, including the additional steps of determining a state of the process cycle based on the detected fluorescent emission and controlling the process cycle based on the state of the process cycle.

20. A method according to claim 19 said determining step including the step of observing the intensity of the fluorescent emission at a specified frequency.

* * * * *